United States Patent [19]
Bien

[11] Patent Number: 5,166,636
[45] Date of Patent: Nov. 24, 1992

[54] DYNAMIC BIASING FOR CLASS A AMPLIFIER

[75] Inventor: David E. Bien, Sunnyvale, Calif.

[73] Assignee: SGS-Thomson Microelectronics, Inc., Carrollton, Tex.

[21] Appl. No.: 727,097

[22] Filed: Jul. 9, 1991

[51] Int. Cl.[5] .............................................. H23F 3/30
[52] U.S. Cl. ..................................... 330/255; 330/273
[58] Field of Search ........................ 330/255, 273, 274

[56] References Cited

U.S. PATENT DOCUMENTS 4,442,409 4/1984 Preslar ................................. 330/274

Primary Examiner—James B. Mullins
Attorney, Agent, or Firm—Richard A. Bachand; Lisa K. Jorgenson; Richard K. Robinson

[57] ABSTRACT

A Class A amplifier has a balanced input circuit including first and second input transistors to receive inverting and non-inverting inputs and to provide an output signal on the collector of the first input transistor. First and second load transistors are associated with the input transistors, the bases of the load transistors being connected to the collector of the second input transistor. An output circuit has source and sink output NPN transistors connected to receive the output signal from the first input transistor, and a circuit is provided for dynamically biasing at least one sink output transistor to have a minimum biasing current in a quiescent state, and increased biasing current in a current sink state. The circuit for dynamically biasing the output transistors has a pair of bias NPN transistors with their collector-emitter paths connected in series, and with the base of one connected to receive the output of the first input transistor. The base of the other bias transistors is connected to the emitter of the one bias transistor and to the base of the sink output transistor. The first and second bias transistors are sized to balance the load seen by the first and second input transistors.

27 Claims, 1 Drawing Sheet

DYNAMIC BIASING FOR CLASS A AMPLIFIER

BACKGROUND OF THE INVENTION

1. Field Of The Invention

This invention relates to improvements in amplifier circuits, and more particularly to improvements in amplifier biasing methods and circuits, and still more particularly to improvements in dynamic biasing methods and circuits for class A amplifiers.

2. Description Of The Prior Art

Operational amplifiers often find use in circuits in which they are required to provide an output which has the capability of sourcing and sinking current to and from an associated load. In typical integrated circuit processes, sourcing current can be accomplished simply, since an NPN transistor can be used for a source transistor. However, sinking current from the load requires special design considerations. One circuit which is widely used to fulfill both sourcing and sinking requirements has a symmetrical output amplifier comprising both NPN and PNP transistors with the collector-emitter path of the NPN transistor being connected between the supply voltage source and the output, and with the collector-emitter path of the PNP transistor connected between the output and a reference potential, or ground. Such circuit structure, however, loses the advantages accompanying NPN transistor circuits, and, moreover, often require special offset compensation design. Furthermore, the design of the required PNP transistor devices is significantly more complicated in device fabrication than would be a corresponding NPN transistor device for the same or similar circuit considerations.

SUMMARY OF THE INVENTION

In light of the above, it is an object of the invention to provide an amplifier which can sink relatively large amounts of output current, with relatively low quiescent currents in the output circuit.

It is another object of the invention to provide a circuit of the type described which can achieve a relatively high current sinking capability without the use of PNP transistors, and without the use of a symmetrical PNP-NPN transistor output combinations.

It is still a further object of the invention in which the offset currents in the circuit can be controlled by the scaling of the transistors in the output circuit, or in the biasing circuit for the output circuit.

It is still another object of the invention to provide a circuit of the type described with a low inherent offset.

In accordance with one embodiment of the present invention, an operational amplifier is provided having an output circuit in which the active devices are high performance NPN transistors, which can both drive or source output currents and sink, or pull in, large amounts of current from the load.

More particularly, a Class A amplifier has a balanced input circuit including first and second input transistors to receive inverting and non-inverting inputs and to provide an output signal on the collector of the first input transistor. First and second load transistors are associated with the input transistors, the bases of the load transistors being connected to the collector of the second input transistor. An output circuit has source and sink output NPN transistors connected to receive the output signal from the first input transistor, and a circuit is provided for dynamically biasing at least the sink output transistor to have a minimum biasing current in a quiescent state, and an increased biasing current in a current sink state. The circuit for dynamically biasing the output transistors has a pair of bias NPN transistors with their collector-emitter paths connected in series, and with the base of one connected to receive the output of the first input transistor. The base of the other bias transistors is connected to the emitter of the one bias transistor and to the base of the sink output transistor. The first and second bias transistors are sized to balance the load seen by the first and second input transistors.

BRIEF DESCRIPTION OF THE DRAWINGS

The invention is illustrated in the accompanying drawing, in which.

DETAILED DESCRIPTION OF THE PREFERRED EMBODIMENTS

Figure 1:
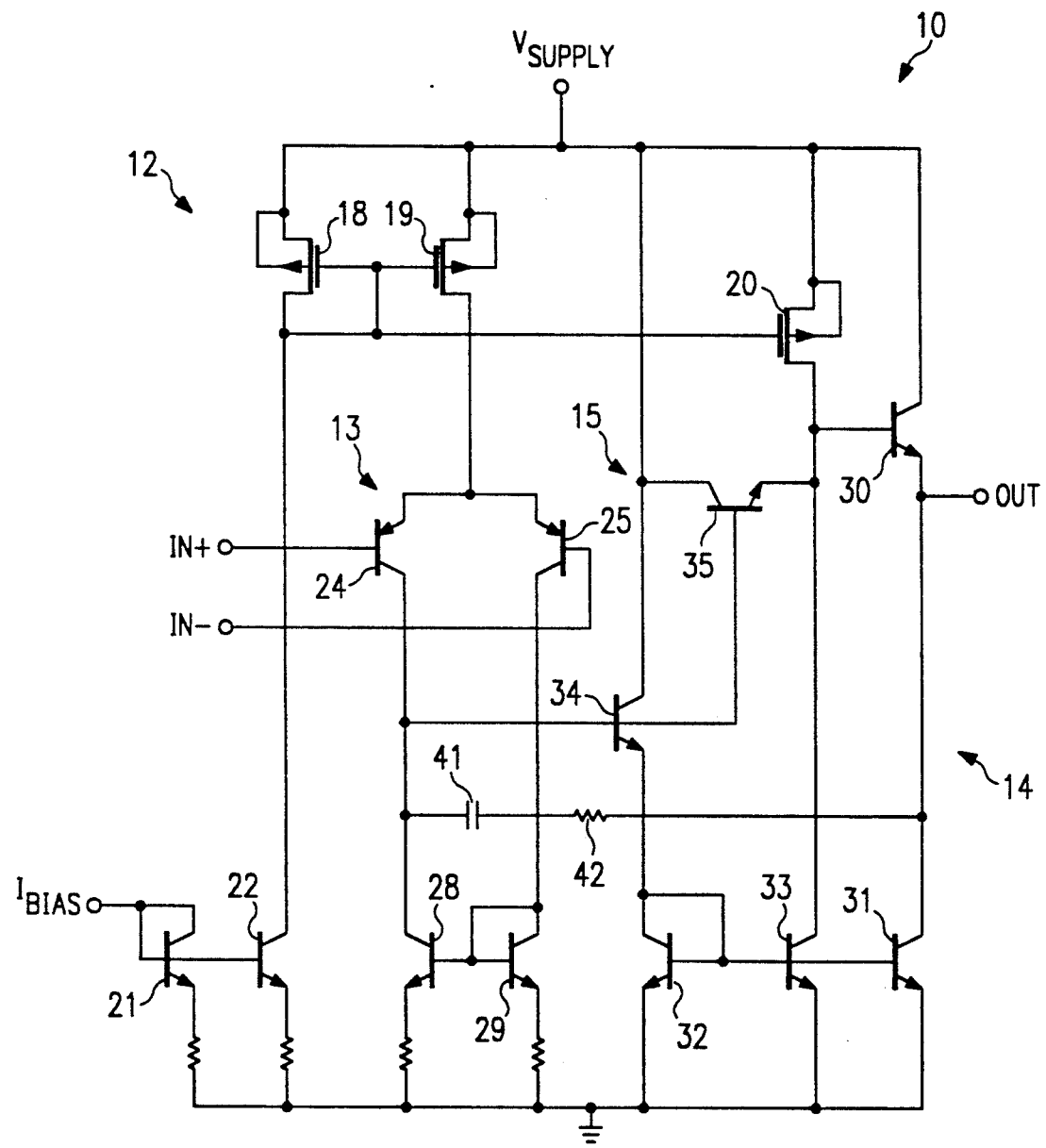
FIG. 1 is an electrical schematic diagram of an amplifier in accordance with the principles of a preferred embodiment of the invention.

A preferred embodiment of the invention is particularly well suited for use in Class A amplifiers, and more particularly for use in conjunction with operational amplifiers, for example of the type illustrated in FIG. 1. The operational amplifier 10 has a non-inverting input, IN+, and an inverting input, IN−, to which input signals are applied, as well known in the art. An output is developed at an output terminal, OUT, to which a load (not shown) may be connected. An additional terminal receives a bias current, $I_{BIAS}$, to establish a dc bias to the current sources of the general bias circuit, as below described, also as well known.

In accordance with a preferred embodiment of the invention, the amplifier 10 has four main circuits, a general bias, or current source, circuit 12, a signal input circuit 13, a signal output circuit 14, and an output biasing circuit 15. The general bias circuit 12 includes FETs 18, 19, and 20 having their source to drain paths connected to the supply voltage, $V_{SUPPLY}$ to serve as current sources for the signal input and output circuits 13 and 14, and a pair of NPN transistors 21 and 22 establish the bias voltages on the gates of the FETs 18, 19, and 20, as above mentioned.

The signal input circuit 13 has a pair of PNP transistors 24 and 25 connected to receive on their respective bases the non-inverting and inverting inputs, IN+ and IN−. It should be noted that the PNP transistors 24 and 25, although shown as bipolar junction transistors, can also be PMOS transistors, for example, which can easily be fabricated and used in CMOS or BICMOS circuitry. The PNP transistors each has its emitter-collector path connected between the source-drain path of the FET 19 and a respective one of a pair of NPN active load transistors 28 and 29. The active load transistors each has its collector-emitter path connected through a resistor (if necessary) to a reference potential, or ground. It will be noted that the output from the signal input circuit 13 is derived from the collector of the PNP transistor 24, to be conducted to the signal output circuit 14.

On the other hand, in accordance with the invention, the bases of the active load NPN transistors 28 and 29 are connected to the collector of the input transistor 25. It will, therefore, be appreciated by those skilled in the art that this balanced arrangement of connections to the circuit of the input circuit 13, together with the sizing of the output bias transistors, below described, will result in little or no offset between the currents in the non-inverting and inverting signal paths.

The signal output circuit 14 is designed in such a way that it can be fabricated entirely of NPN transistors, 30–35. Thus, it will be appreciated that the amplifier 10 will have the advantages attendant in such construction, such as ease of layout design and fabrication, the ability to sink relatively large currents from any load connected to the output terminal, OUT, and so forth. In contrast to the widely seen arrangement in the prior art of complementary NPN and PNP transistors, the output circuit 10 has two NPN transistors 30 and 31 having current flow paths between the supply voltage, $V_{SUPPLY}$, and ground, with the output signal being derived at the emitter-collector connection between them.

The signal path for the output transistors 30 and 31 is provided by the transistors 32–35 of the output biasing circuit 15. Thus, the signal output from the input circuit 13 is applied to the bases of NPN transistors 34 and 35, which act as emitter follower amplifiers to conduct the signal to the respective collectors of NPN transistors 32 and 33. Additionally, the biasing for the output transistors 30 and 31 and more particularly, the current sinking transistor 31, is provided by the NPN transistors 32–35.

In operation, for example, in the situation in which the circuit is used to source a current, or drive a current to the load at the output terminal, OUT, the transistor 30 is suitable, because it can provide substantial current, being based upon the current provided by the FET 20 current source, multiplied by the current gain of the transistor 30. On the other hand, in the situation in which the circuit is used to sink or pull in a current, the transistor 31 must be relied upon. If the transistor 31 were to be set up merely as a current source, without control, as might be expected using NPN transistor devices, the transistor 31 would be unable to sink substantial current from the load at the output terminal, except that to which it is fixed or established to provide as a current source. That is, in order to provide a large current sinking capability, a large quiescent bias current must ordinarily be established for the transistor 31.

According to the invention, however, dynamic biasing is provided to transistor 31, principally by transistors 34 and 32. The transistor 34 controls the current flowing both through itself and through transistor 32. Consequently, when a need arises to sink large currents in transistor 31, the current in both transistors 34 and 32 increases, which, in turn increases the current which is available through transistor 31.

Transistor 33 is also a part of the signal path, and receives current from the current source provided by FET 20. It will be appreciated that the operation of the amplifier 10 is intended to be linear (or Class A), and, therefore, the current from FET 20 would also flow through the transistor 33, except as required for the base current of transistor 30. As the base of transistor 34 is pulled up, the currents in both transistors 32 and 33 increase. However, the increase in current through transistor 33 causes the base of transistor 30 to be pulled down, or fall in voltage. This would be a situation which would be encountered, for example, when positive current were being supplied, and a change is made to an operating mode in which current is to be sinked from the load. Under this condition, the current in transistor 33 would increase, tending to rapidly turn off the output transistor 30. However, as the current in transistor 33 reaches the limit of current which can be supplied by the current source FET 20, the transistor 33 would begin to saturate. To prevent transistor 33 from saturating due to the rapid fall in voltage on its base, transistor 35 establishes an alternate current path, as transistor 33 tries to conduct more current than is available from FET 20. Transistor 35, therefore, serves as an "anti-saturation transistor" or clamp.

Frequency compensation across the anticipated operating frequency range of the amplifier is provided by the capacitor 41 and resistor 42, in a known manner.

In sum, the arrangement of transistors 34, 32, 33, and 31 provides a much more controlled current than heretofore available. The current in transistor 32 can be made to be equal to the sum of the currents in active load transistors 28 and 29, for example, by device sizing, so the base current in transistor 34 is approximately equal to the current taken up by the connection of the collector of transistor 29 to the bases of transistors 28 and 29. So dynamic biasing is achieved, together with low inherent offset, and with currents which are independent of the entire process.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. An amplifier having inputs to receive first and second input signals, and an output for connection to a load, comprising:

first and second input signal paths in which current is controlled in accordance with said first and second input signals;

first and second load transistors respectively in said first and second input signal paths, each of said first and second load transistors having a control element connected to said second input signal path;

first and second output transistors of the same conductivity type connected to receive an output signal from said first input signal path, said first output transistor for sourcing current to the load, and said second output transistor for sinking current from the load, in accordance with said first and second input signals;

a circuit connected to said first current path for reducing any current offset in the first and second input signal paths; and a circuit for dynamically biasing said second output transistor with substantially minimum biasing current in a quiescent state, and sufficient biasing current to be enabled to sink current from said output terminal in a non-quiescent state.

2. The amplifier of claim 1 wherein said amplifier is a Class A amplifier.

3. The amplifier of claim 2 wherein said amplifier is an operational amplifier.

4. The amplifier of claim 3 wherein said inputs to receive said first and second input signals are inverted and non-inverted signal connections.

5. The amplifier of claim 1 further comprising a circuit for supplying bias current to said first output transistor.

6. The amplifier of claim 5 wherein said circuit for supplying bias current to said first output transistor comprises a current source and a transistor having an emitter-collector path in series between said current source and a reference potential, and a base to receive said output signal from said first input signal path.

7. The amplifier of claim 6 further comprising an anti-saturation circuit connected to prevent said transistor in said circuit for supplying bias current to said first output transistor from saturating when said first output transistor changes from conducting to non-conducting states.

8. The amplifier of claim 1 wherein said circuit for dynamically biasing said second output transistor comprises first and second bias transistors of the same conductivity type, having collector-emitter paths connected between a voltage supply and a reference potential, the output of said first input signal path being connected to the base of said first bias transistor, and said emitter of said first bias transistor being connected to the bases of said second bias transistor and said second output transistor.

9. The amplifier of claim 8 wherein said first and second output transistors and said first and second bias transistors are all of the same conductivity type.

10. The amplifier of claim 9 wherein said first and second output transistors and said first and second bias transistors are NPN transistors.

11. The amplifier of claim 10 wherein said circuitry for reducing the current offset in the first and second input signal paths comprises said first and second bias transistors that have their emitters sized to balance the loads in said first and second input signal paths.

12. The circuit of claim 1 wherein said load transistors comprise a first NPN transistor having an emitter, a base control element, and a collector, the collector of the first NPN transistor being connected to said first input signal path and the emitter of the first NPN transistor being connected to a resistor connected to a reference potential; and a second NPN transistor having an emitter, a base control element, and a collector, the collector of the second NPN transistor being connected to the second input signal path, the base of the second NPN transistor being connected to the second input signal path and the base of the first NPN transistor, and the emitter of the second NPN transistor being connected to a resistor connected to a reference potential.

13. An amplifier having inputs to receive first and second input signals, and an output for connection to a load, comprising:
first and second input signal paths;
first and second load transistors respectively in said first and second input signal paths, each of said first and second load transistors having a control element connected to said second input signal path;
a circuit for controlling a current in said first and second input signal paths in accordance with said first and second input signals;
a circuit connected to said first input signal path for reducing any current offset in the first and second input signal paths;
first and second output NPN transistors connected to receive an output signal from said first input signal path, said first output NPN transistor for sourcing current to the load, and said second output NPN transistor for sinking current from the load, in accordance with said first and second input signals; and
an NPN transistor circuit for dynamically biasing said second output NPN transistor with a bias current which increases from a quiescent level in relation to the level of current being sinked from the load by said second output NPN transistor.

14. The amplifier of claim 13 wherein said amplifier is a Class A amplifier.

15. The amplifier of claim 14 wherein said amplifier is an operational amplifier.

16. The amplifier of claim 15 wherein said inputs are inverted and non-inverted signal connections.

17. The amplifier of claim 13 further comprising a circuit for supplying bias current to said first output NPN transistor.

18. The amplifier of claim 17 wherein said circuit for supplying bias current to said/first output NPN transistor comprises a current source and an NPN transistor having an emitter-collector path in series between said current source and a reference potential, and a base to receive said output signal from said first input signal path.

19. The amplifier of claim 18 further comprising an anti-saturation circuit connected to prevent said NPN transistor in said circuit for supplying bias current to said first output NPN transistor from saturating when said first output NPN transistor changes from conducting to non-conducting states.

20. The amplifier of claim 13 wherein said circuit for dynamically biasing said second output NPN transistor comprises first and second bias NPN transistors, having collector-emitter paths connected between a voltage supply and a reference potential, the output of said first input signal path being connected to the base of said first bias NPN transistor, and said emitter of said first bias NPN transistor being connected to the bases of said second bias NPN transistor and said second output NPN transistor.

21. The amplifier of claim 20 wherein said circuitry for reducing the current offset in the first and second input signal paths comprises said first and second bias transistors that have their emitters sized to balance the loads in said first and second input signal paths.

22. The circuit of claim 13 wherein said load transistors comprise a first NPN transistor having an emitter, a base control element, and a collector, the collector of the first NPN transistor being connected to said first input signal path and the emitter of the first NPN transistor being connected to a resistor connected to a reference potential, and a second NPN transistor having an emitter, a base control element, and a collector, the collector of the second NPN transistor being connected to the second input signal path, the base of the second NPN transistor being connected to the second input signal path and the base of the first NPN transistor, and the emitter of the second NPN transistor being connected to a resistor connected to a reference potential.

23. A Class A amplifier having inverting and non-inverting inputs and an output for sourcing and sinking current from a load, comprising:
an input circuit comprising:
first and second input transistors to receive on respective ones of their bases the inverting and non-inverting inputs, said input circuit providing an output signal on the collector of said first input transistor;
and first and second load transistors associated with said respective input transistors, the bases of said first and second load transistors being connected to the collector of said second input transistor;

an output circuit comprising first and second output NPN transistors connected to receive the output signal from the collector of said first input transistor;

a circuit for dynamically biasing at least one said output NPN transistors to have substantially minimum biasing current in a quiescent state, and sufficient biasing current to be enabled to sink current from said load in a non-quiescent state;

and a biasing circuit to source current at least to said input and output circuits.

24. The class A amplifier of claim 23 wherein said circuit for dynamically biasing said output NPN transistors comprises first and second bias NPN transistors having collector-emitter paths connected in series between a voltage source and a reference potential, the base of said first bias NPN transistor receiving said output signal of said first input transistor, and the base of said second bias NPN transistor being connected to the emitter of said first bias NPN transistor and to the base of at least one of said output NPN transistors of the output circuit which is enabled to sink current from said load in a non-quiescent state.

25. The class A amplifier of claim 24 wherein said circuit for dynamically biasing said output NPN transistors further comprises a third and fourth bias NPN transistors, said third bias NPN transistor having a collector-emitter path connected between said bias circuit and a reference potential, and having a base connected to the base of said second bias NPN transistor, and said fourth bias NPN transistor having a collector-emitter path connected between said voltage source and said bias circuit and having a base connected to receive said signal on the collector of said first input transistor.

26. The class A amplifier of claim 24 wherein said first and second bias NPN transistors have their emitters sized to balance the loads presented to the collectors of said first and second input transistors.

27. The class A amplifier of claim 23 wherein said circuit for dynamically biasing said output NPN transistors comprises first and second bias NPN transistors, said first bias NPN transistor being connected to control the current flowing both through itself and through said second bias NPN transistor in response to said output signal from said input circuit, whereby when said output NPN transistors are required to sink large currents, the current in both said first and second bias NPN transistors increases, to increase the current available to said output NPN transistors.

* * * * *